(12) United States Patent
Miao et al.

(10) Patent No.: US 6,316,992 B1
(45) Date of Patent: Nov. 13, 2001

(54) DC OFFSET CALIBRATION FOR A DIGITAL SWITCHING AMPLIFIER

(75) Inventors: Guoqing Miao, Roselle Park, NJ (US); Cary L. Delano, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/624,503

(22) Filed: Jul. 24, 2000

Related U.S. Application Data

(60) Provisional application No. 60/146,416, filed on Jul. 29, 1999.

(51) Int. Cl.[7] .............................. G01R 19/00; H03F 1/02; H03F 03/217; H03L 5/00; H03K 17/00
(52) U.S. Cl. ................................ 330/2; 330/9; 330/251; 330/207 A; 327/307; 327/124
(58) Field of Search .............................. 330/2, 9, 207 A; 330/251; 327/307, 124

(56) References Cited

U.S. PATENT DOCUMENTS

| | | |
|---|---|---|
| 4,495,470 | 1/1985 | Bristol ..................................... 330/9 |
| 5,298,898 | 3/1994 | Brunheim ............................. 341/118 |
| 5,789,974 | 8/1998 | Ferguson, Jr. et al. .................. 330/2 |
| 5,867,777 | 2/1999 | Yamaji et al. ..................... 455/234.1 |
| 5,990,734 | 11/1999 | Wright et al. ............................. 330/2 |

*Primary Examiner*—Robert Pascal
*Assistant Examiner*—Patricia T. Nguyen
(74) *Attorney, Agent, or Firm*—Beyer Weaver & Thomas LLP

(57) ABSTRACT

An offset voltage calibration circuit for use with a digital switching amplifier. The calibration circuit includes an analog-to-digital converter for converting at least one DC offset voltage associated with the digital switching amplifier to digital offset data. A memory stores the digital offset data. Control circuitry controls the analog-to-digital converter. A digital-to-analog converter coupled to the memory receives the digital offset data and generates an offset compensation voltage for applying to an input port of the digital switching amplifier which thereby cancels at least a portion of the at least one DC offset voltage.

12 Claims, 7 Drawing Sheets

DC OFFSET CALIBRATION FOR A DIGITAL SWITCHING AMPLIFIER

RELATED APPLICATION DATA

The present application claims priority from U.S. Provisional Patent Application No. 60/146,416 for DC OFFSET SELF-CALIBRATION SYSTEM FOR A DIGITAL SWITCHING POWER AMPLIFIER filed on Jul. 29, 1999, the entirety of which is incorporated herein by reference for all purposes.

BACKGROUND OF THE INVENTION

The present invention relates to the operation of digital switching amplifiers. More specifically, the present invention provides methods and apparatus for calibrating a digital switching amplifier to reduce its DC offset voltage.

FIG. 1 is a simplified schematic of a digital switching amplifier 100 which will be used to illustrate the DC offset voltage problem addressed by the present invention. For purposes of illustration, amplifier 100 will be described as operating in the audio frequency range (i.e., 10 Hz to 20 kHz). However, it will be understood that the problem and the solutions described herein apply to a much wider variety of amplifier configurations and operating frequency ranges.

An input audio signal is received by amplifier 100 and converted to a one-bit signal by a noise-shaping oversampled feedback loop which includes loop filter 102, comparator 104, break-before-make generator 106, power stage driver 108, and power stage 110. For purposes of this example, loop filter 102 is implemented using a plurality of operational amplifiers configured differentially. The one-bit signal drives the power stage 110 which, in turn, drives a low pass filter comprising inductor 112 and capacitor 114 which recovers the audio signal with which speaker 116 is driven.

Any DC offset inherent in amplifier 100 is amplified by the gain in power stage 110 and appears across speaker 116. This presents a couple of problems. First, a DC offset voltage across the relatively low impedance (e.g., 4 ohms) of a typical speaker causes a DC current through the speaker which can cause damage to the speaker. Second, such a DC offset voltage could potentially cause a power supply pumping problem which pushes the power supply voltage to a level which could damage both the speaker and the amplifier.

The DC offset in an amplifier configured like amplifier 100 of FIG. 1 comes from two main sources; the offset in the operational amplifiers of loop filter 102, and resistor mismatches. Cancellation of offset in operational amplifiers may be accomplished using techniques such as the chopper stabilization technique or the correlated double sampling technique. However, these techniques do not address the offset due to the resistor mismatches. Laser trimming of resistors may be used to eliminate such mismatches, but this approach requires special processing technology and can be prohibitively expensive.

One approach to reducing the DC offset voltage in amplifier 100 is described with reference to the schematic diagram of FIG. 2. This technique takes advantage of the fact that, in a digital switching amplifier, all of the different offset voltage sources may be modeled by a single input DC offset voltage, cancellation of which effectively cancels the offset contributions of each of the various sources. According to the technique illustrated in FIG. 2, a potentiometer 202 is used with amplifier 100 to generate a DC voltage which cancels the amplifier's output offset voltage. Additionally, a decoupling capacitor 204 is used to decouple high frequency noise at this node. This technique has significant drawbacks.

That is, where amplifier 100 is an integrated circuit, components (202 and 204) which are external to the integrated circuit amplifier are required. In addition, any variation in the DC offset voltage due to output power level variation and changes in temperature and other environmental conditions requires readjustment of potentiometer 202. These are both undesirable in most contexts in which such an amplifier is employed.

Another approach to dealing with the DC offset voltage problem is illustrated by the schematic diagram of FIG. 3. According to this approach, an active integrator circuit 302 provides a feedback path from the output to the input of amplifier 100. Any DC offset voltage is integrated by integrator 302 thereby generating a DC voltage which is fed back to the amplifier's input stage to cancel the input referred DC offset. Despite the relative simplicity and effectiveness of this approach, there are significant barriers to its practical implementation. First, this technique does not cancel any offset contribution from operational amplifier 304 on which integrator 302 is based. Thus, any DC offset associated with operational amplifier 304 eventually shows up at the output of amplifier 100.

Second, for specific implementations, the components used to implement integrator 302 may need to be fairly large. For example, in an audio application, the transfer function for the feedback path through integrator 302 must have a very low corner frequency, i.e., below 10 Hz, to avoid having an appreciable effect on the audio signal. Such a low comer frequency requires very large resistor and capacitor values which makes integration with amplifier 100 all but impossible. Therefore, an external circuit would typically need to be used which, as described above, is an undesirable solution.

Therefore, it is desirable that more effective techniques be developed for dealing with DC offset voltages in digital switching amplifiers.

SUMMARY OF THE INVENTION

According to the present invention, a DC offset voltage calibration technique for a digital switching amplifier is provided which generates a DC voltage with reference to the output power level of the amplifier and injects the DC voltage at the amplifier's input to thereby cancel at least a portion of the amplifier's DC offset voltage. In a calibration mode, the DC offset voltage of the amplifier is digitized and these offset data are stored for a number of different output power levels. In operation, information regarding the output power level of the amplifier is used to retrieve the stored information for the indicated output power level and a digital-to-analog converter generates the appropriate voltage to inject at the amplifier's input.

According to a specific embodiment of the invention, portions of the digital switching amplifier are used to effect amplification of the amplifier's offset voltage. That is, because the DC offset voltage range for such an amplifier is typically fairly small (e.g., 50 mV) and the resolution necessary for digitizing the offset voltage fairly high (e.g., less than 50 uV), the DC offset voltage is amplified by the amplifier's loop filter during the calibration process to achieve the necessary resolution.

Thus, the present invention provides an offset voltage calibration circuit for use with a digital switching amplifier. The calibration circuit includes an analog-to-digital converter for converting at least one DC offset voltage associated with the digital switching amplifier to digital offset data. A memory stores the digital offset data. Control circuitry controls the analog-to-digital converter. A digital-to-analog converter coupled to the memory receives the digital offset data and generates an offset compensation voltage for applying to an input port of the digital switching amplifier which thereby cancels at least a portion of the at least one DC offset voltage.

According to a more specific embodiment, an offset voltage calibration circuit for use with a digital switching amplifier is provided. The digital switching amplifier includes an output level control circuit. An analog-to-digital converter converts each of a plurality of DC offset voltages associated with the digital switching amplifier to digital offset data. Each of the DC offset voltages corresponds to a particular output level of the digital switching amplifier as controlled by the output level control circuit. A memory which is configured to receive output level data from the output level control circuit stores the digital offset data. Control circuitry controls the analog-to-digital converter and the memory to effect storage of the digital offset data. A digital-to-analog converter is coupled to the memory. In operation, the memory transmits a portion of the digital offset data to the digital-to-analog converter in response to the output level data. The digital-to-analog converter generates an offset compensation voltage in response to the portion of the digital offset data for applying to an input port of the digital switching amplifier thereby canceling at least a portion of the DC offset voltage.

The present invention also provides a method for reducing a DC offset voltage associated with a digital switching amplifier. The DC offset voltage is converted to digital offset data which are stored in a memory. During normal operation of the digital switching amplifier, the digital offset data are converted to an offset compensation voltage which is then applied to an input port of the digital switching amplifier thereby canceling at least a portion of the DC offset voltage.

According to a more specific embodiment, the present invention also provides a method for reducing a DC offset voltage associated with a digital switching amplifier which operates in a calibration mode and an operation mode. In the calibration mode, for each of a plurality of output levels of the digital switching amplifier a corresponding DC offset voltage is converted to corresponding digital offset data which are stored for each output level in a memory. In the operation mode, a portion of the digital offset data are selected from the memory in response to output level data indicating a corresponding output level of the digital switching amplifier. The portion of the digital offset data are converted to an offset compensation voltage. The offset compensation voltage is then applied to an input port of the digital switching amplifier thereby canceling at least a portion of the DC offset voltage corresponding to the corresponding output level.

A further understanding of the nature and advantages of the present invention may be realized by reference to the remaining portions of the specification and the drawings.

DETAILED DESCRIPTION OF SPECIFIC EMBODIMENTS

Figure 1:
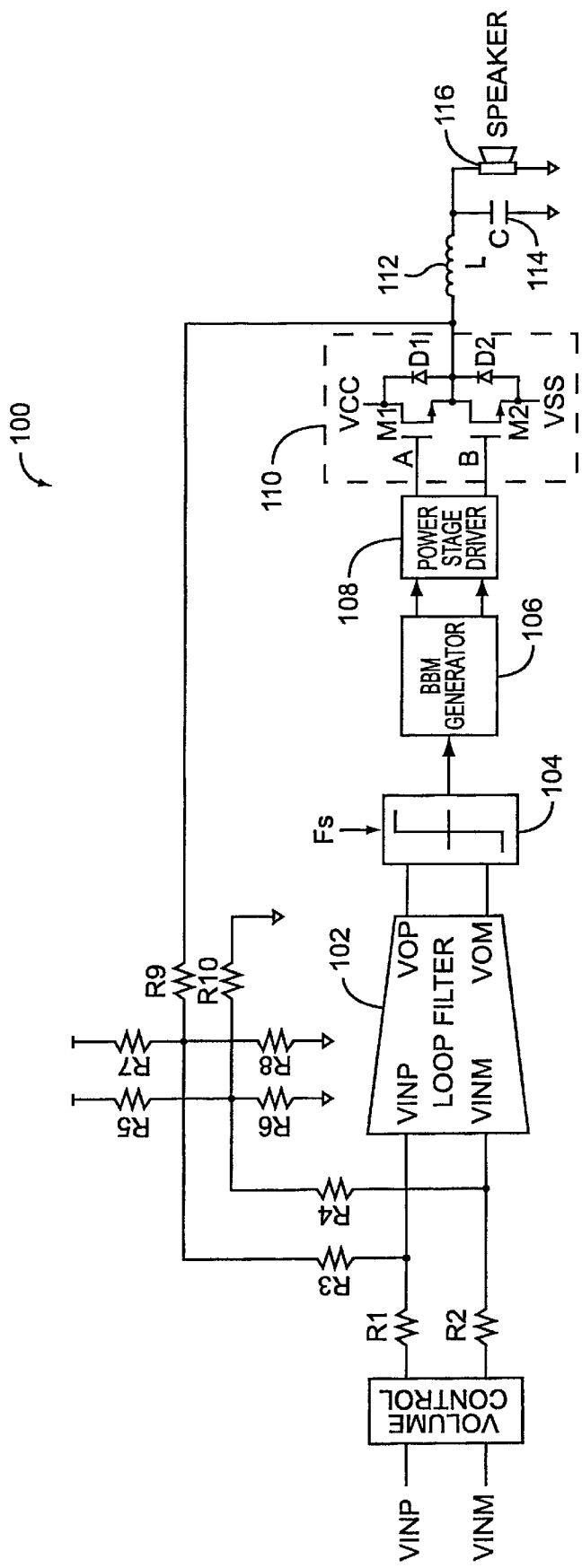
FIG. 1 is a simplified schematic diagram of a digital switching amplifier for illustrating the DC offset problem.
Figure 2:
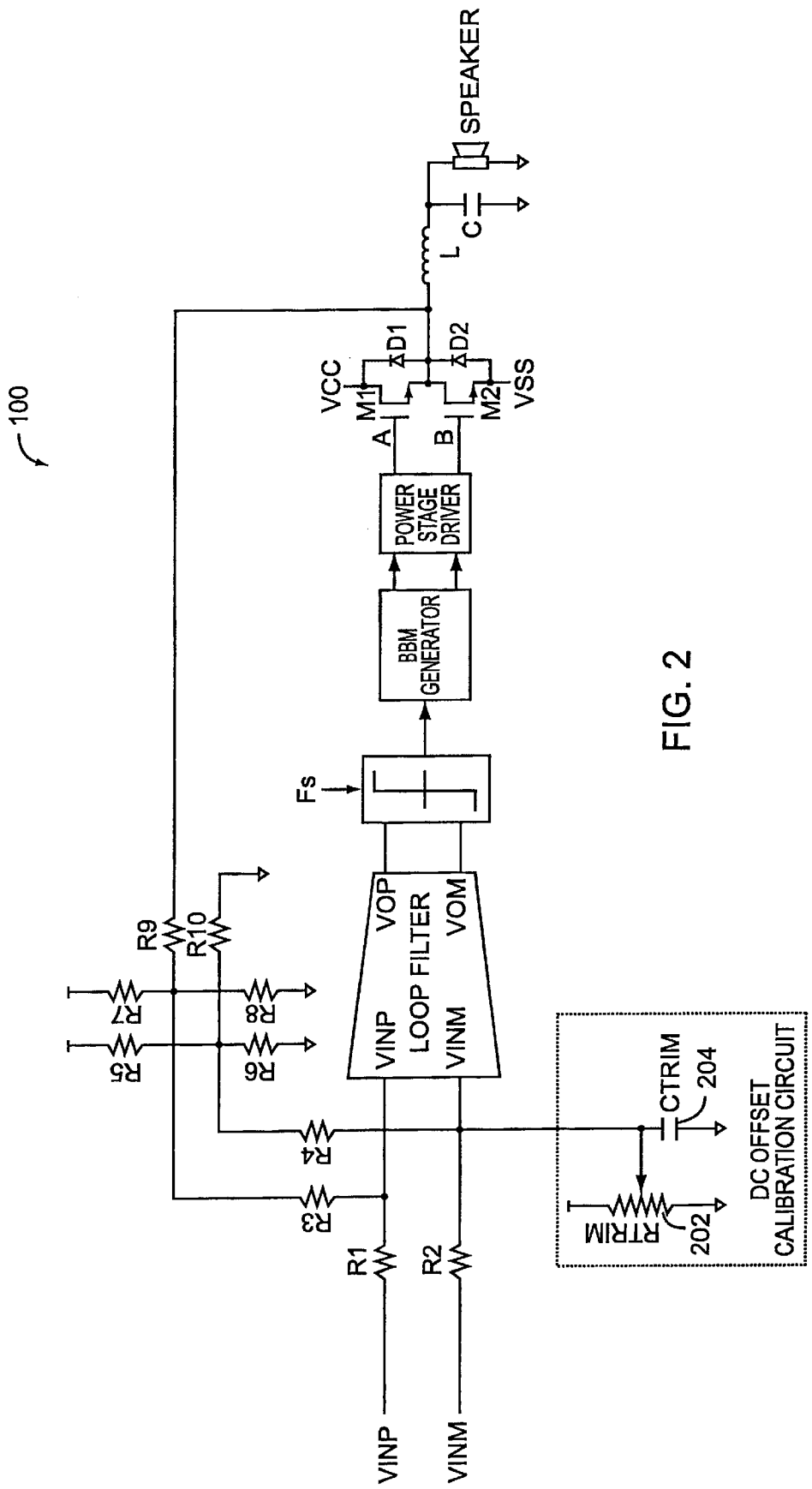
FIG. 2 is simplified schematic diagram of a previous solution to the DC offset problem.
Figure 3:
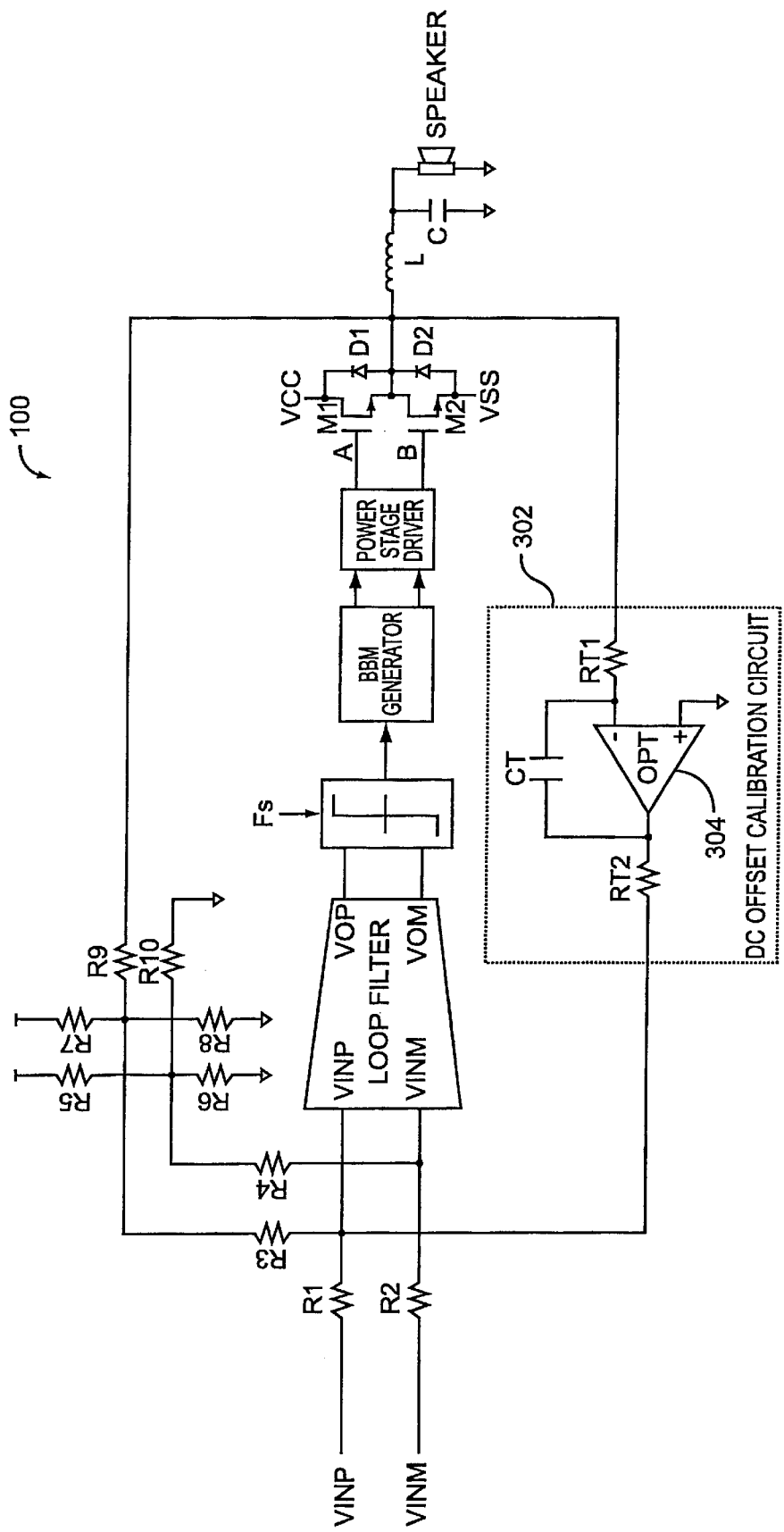
FIG. 3 is a simplified schematic diagram of another previous solution to the DC offset problem.
Figure 4:
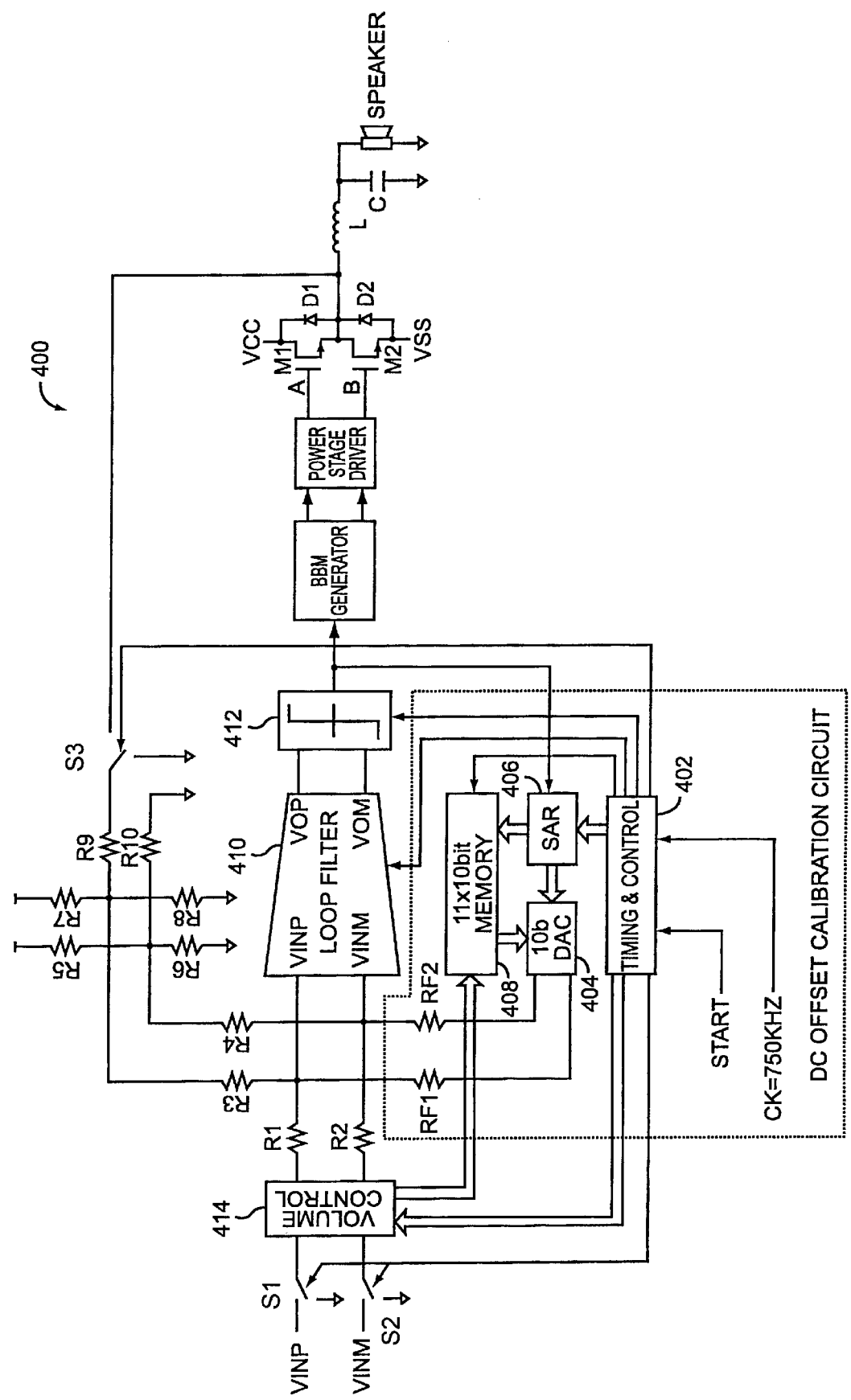
FIG. 4 is a simplified schematic diagram of a digital switching amplifier incorporating the DC offset calibration technique of the present invention.

FIG. 4 is a simplified schematic of a digital switching amplifier 400 with an offset calibration circuit designed in accordance with a specific embodiment of the present invention. The offset calibration circuit includes a timing and control block 402, a 10-bit monotonic digital-to-analog converter (DAC) 404, a successive approximation register (SAR) 406, and an 11×10-bit memory 408. Three switches S1, S2, and S3 are included in the amplifier's input signal and feedback paths. Each time amplifier 400 is powered up or awakened from sleep mode the amplifier's DC offset is calibrated. That is, offset data are generated and stored for each of a plurality of output levels.

During the calibration process switches S1, S2, and S3 connect their respective nodes to ground thereby disconnecting the amplifier's differential inputs and opening the amplifier's feedback loop. Together with loop filter 410 and comparator 412, DAC 404 and SAR 406 form a 10-bit successive approximation type analog-to-digital converter (ADC) which is used to convert the amplifier's open loop DC offset voltage at a plurality of output levels to 10-bit offset data for storage in memory 408. The process by which these offset data are generated will be discussed in greater detail below.

During normal operation of amplifier 400, switches S1, S2, and S3 reconnect the amplifier's differential inputs and close the feedback loop. The 10-bit offset data in memory 408 which correspond to the current output level of the amplifier (as indicated by output level data received from volume control circuit 414) are transmitted to DAC 404 which converts the received offset data to an analog offset compensation voltage. That is, data representing the volume setting are used as an address to access the appropriate offset data in memory 408 which are then converted to the offset compensation voltage. The offset compensation voltage is then applied to the differential inputs of loop filter 410 via resistors RF1 and RF2 to cancel all or part of the current DC offset voltage.

According to the specific embodiment described herein with reference to FIG. 4, memory 408 has digital offset data for 11 different volume settings or output levels and thus generates 11 different offset compensation voltages corresponding to the different output levels. As will be understood, however, the present invention is not limited to such an embodiment. That is, according to the invention, an amplifier with an offset calibration circuit is contemplated which may generate offset compensation voltages for a greater or fewer number of output levels including, for example, a single output level. In addition, offset data may be stored for a variety of different or additional parameters such as, for example, temperature.

Direct digitization of the DC offset voltage of amplifier 400 requires that the analog-to-digital conversion circuitry have a very high resolution. For example, for 10-bit accuracy and a 50 mV input offset calibration range, a resolution of less than 50 uV is required. This presents a difficult design problem. Therefore, according to a specific embodiment of the present invention, in the calibration mode, the DC offset voltage is amplified by a gain stage before the analog-to-digital conversion takes place.

Figure 5:
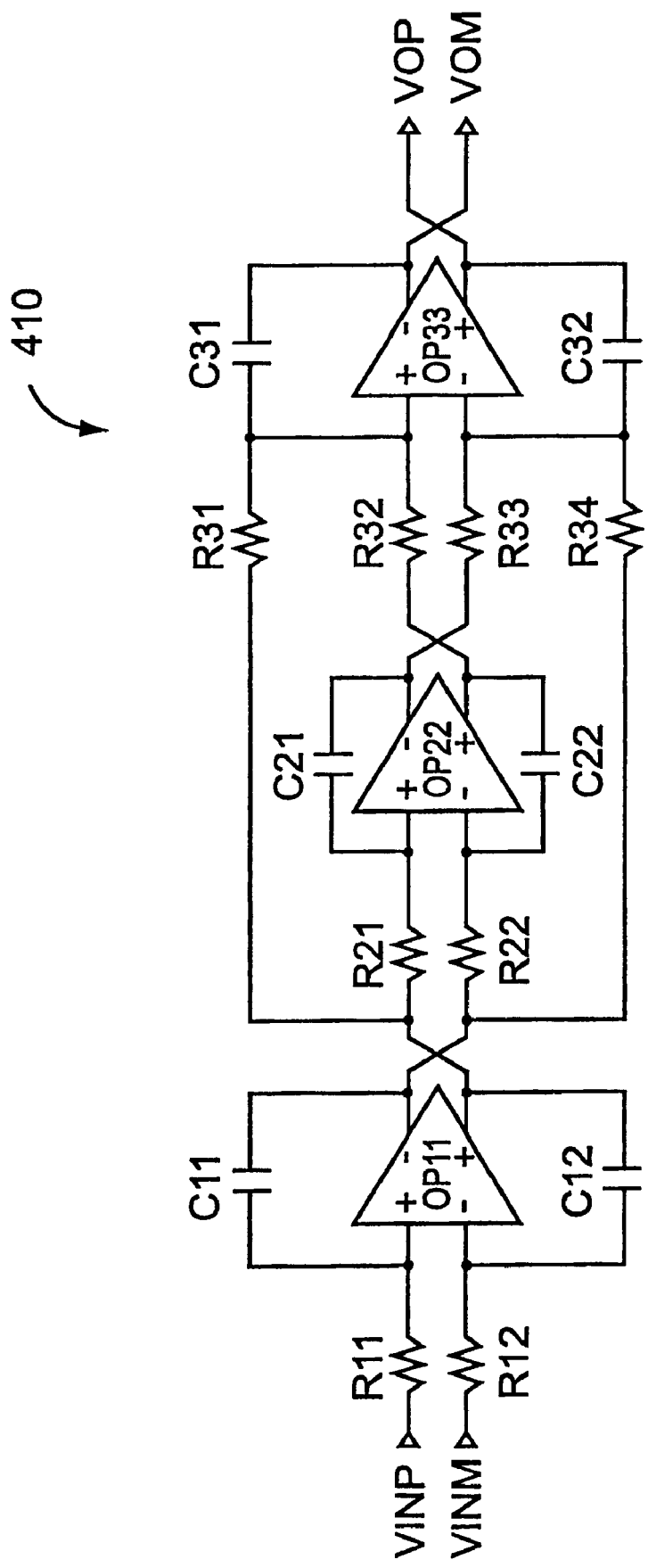
FIG. 5 is a more detailed schematic diagram of a loop filter for use with the digital switching amplifier of FIG. 4.

According to a more specific embodiment and as shown in FIG. 4, to reduce circuit complexity, part of the feedback loop of amplifier 400, i.e., loop filter 410, is employed in the calibration mode for amplification of the DC offset voltage. FIG. 5 shows a specific implementation of a loop filter 410 which includes three RC active integrator stages and has a very high DC gain. Where the loop filter is operating open loop as during the DC offset calibration procedure discussed above, and where the equivalent input DC offset of the amplifier is designated Vos, the voltage at the output of the first integrator is given by:

$$Voa(t) = \frac{Vos}{R_{11}C_{11}} t$$

The voltage at the output of the second integrator is given by:

$$Vob(t) = \frac{Vos}{2R_{11}C_{11}R_{21}C_{21}} t^2$$

And the voltage at the output of the third integrator is given by:

$$Voc(t) = \frac{Vos}{6R_{11}C_{11}R_{21}C_{21}R_{32}C_{32}} t^3 + \frac{Vos}{2R_{11}C_{11}R_{31}C_{31}} t^2$$

From the foregoing, it is apparent that the amplification provided by the loop filter during the calibration process may be increased by increasing the integration time. According to a specific embodiment described herein, for an integration time of 30.7 us, a gain of approximately 6273 or 76 dB results. Thus, for a 50 uV offset, the amplified value would be 313.7 mV which is large enough for easy detection and digitization.

A specific embodiment of the DC offset calibration process will now be described with reference to the timing diagram of FIG. 6. For each DC offset voltage, i.e., for each of plurality of output level settings, the successive approximation algorithm is used to digitize the amplifier's DC offset as amplified by loop filter 410 starting with the most significant bit, i.e., B9, and ending with the least significant bit, i.e., B0. A 750 kHz clock is used to generate the control signals for the process. For each bit, 32 clock periods are used which takes about 42.7 us. Thus, to digitize a particular DC offset voltage requires approximately 427 us.

Figure 6:
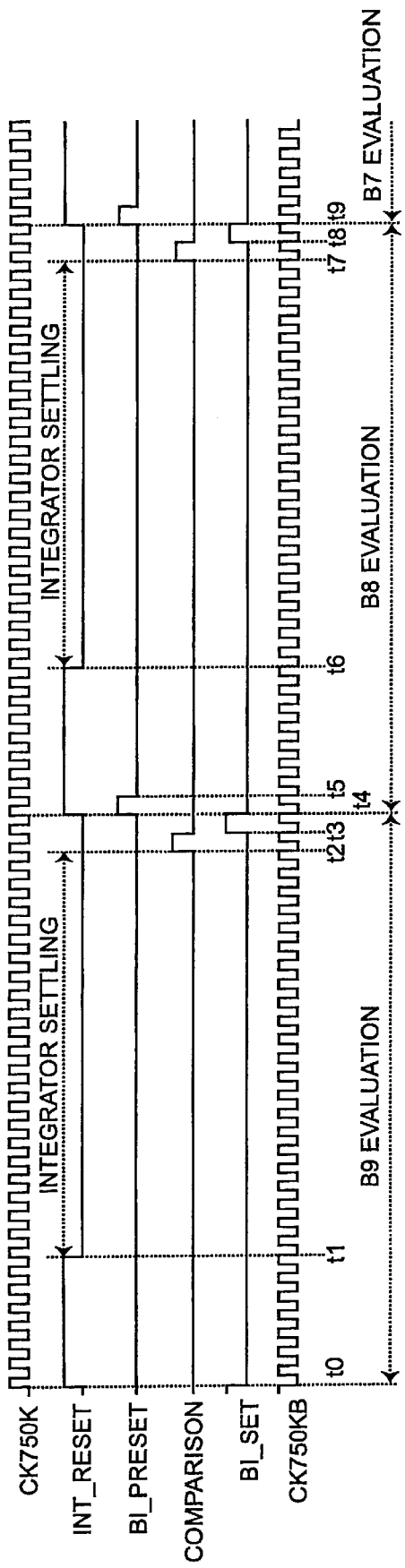
FIG. 6 is a timing diagram of the timing and control signals for operating the digital switching amplifier of FIG. 4 according to a specific embodiment of the invention.

Referring now to FIGS. 4 and 6, B9, the sign bit of the digitized DC offset, is evaluated first (t0–t4). Between times t0 and t1, the outputs of all three integrators in loop filter 410 are set to zero as indicated by INT_RESET going high. According to the specific embodiment described herein, this requires eight clock periods or 10.7 us. From t1 to t2 (23 clock periods or 30.7 us) the input DC offset is amplified with a gain of 76 dB by the integrator stages of loop filter 410. This is indicated in FIG. 6 as the integrator settling period. The value for the offset is detected at t3 as indicated by COMPARISON going high between t2 and t3. That is, if the output DC offset voltage is positive, B9 is set to 1. Otherwise, B9 is set to 0. Each bit value is set by BI_SET going high as shown between t3 and t4. The value of B9 is used to select the voltage reference for the 10-bit DAC which will be described in greater detail below with reference to FIG. 7.

The next most significant bit, B8, is evaluated from t4 to t9. Between t4 and t6, the outputs of the integrators are again set to zero as indicated by INT_RESET going high. Between t4 and t5, B8 is preset to 1 as indicated by BI_PRESET going high. With the 10-bit DAC 404, this has the effect of adding a compensation voltage Vcp to the amplifier input. According to a specific embodiment, where B9=1, Vcp=−50 mV, and where B9=0, Vcp=50 mV. The remaining input referred DC offset is therefore Vos−Vcp. From t6 to t7 (23 clock periods or 30.7 us) the input DC offset is amplified with a gain of 76 dB by loop filter 410 (integrator settling time). The value for B8 is detected at t8 as indicated by COMPARISON going high between t7 and t8. That is, if the polarity of the amplified output DC offset voltage is positive, Y is set to 1. If it is negative, Y is set to 0. The value of B8 is then determined using a nor-exclusive-or operation with the values Y and B9 as operands. The value of B8 is then set as indicated by BI_SET going high between t8 and t9.

Each successive bit B7–B0 is set in a manner similar to the process described for setting B8, i.e., with the preceding bit(s) set and the DC offset voltage partially compensated by the output of DAC 404. According to a specific embodiment, at the end of the calibration process, the remaining input referred DC offset will be below 0.1 mV.

Figure 7:
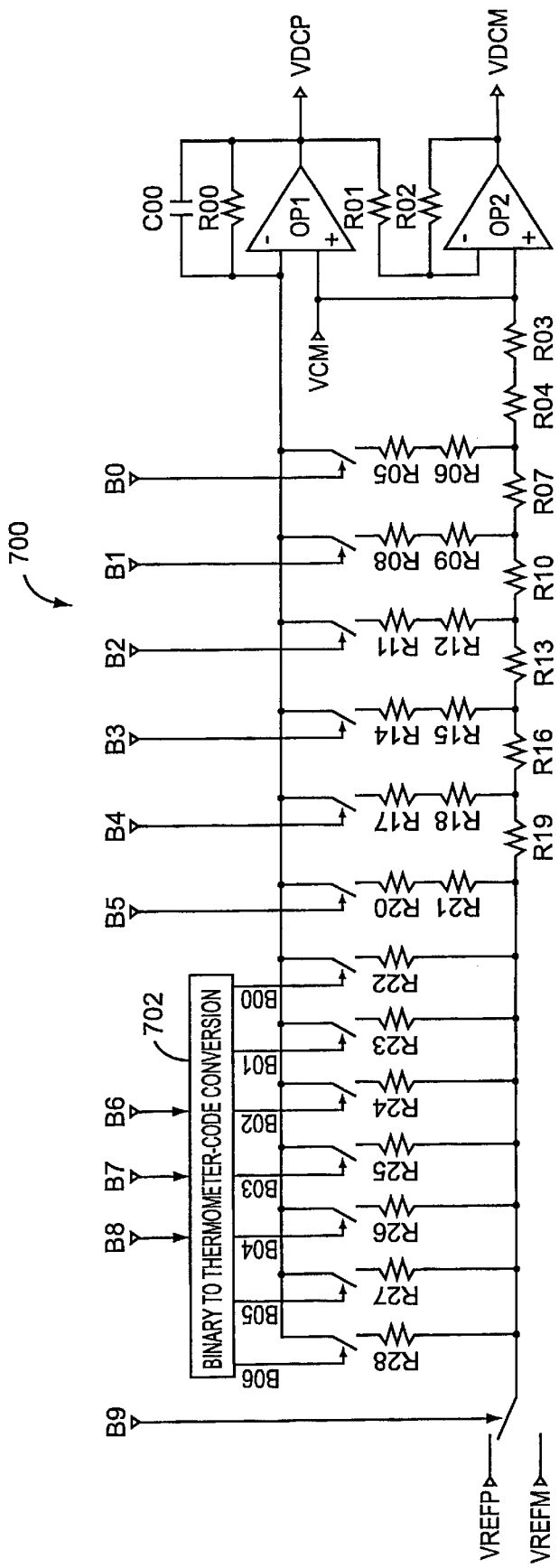
FIG. 7 is a more detailed schematic diagram of a 10-bit DAC for use with the digital switching amplifier of FIG. 4.

A specific embodiment of a 10-bit digital-to-analog converter (DAC) 700 for use with the present invention will now be described with reference to the schematic diagram of FIG. 7. As described above with reference to DAC 404 of FIG. 4, DAC 700 is used in the digitization of an amplifier's DC offset voltage as well as to generate the offset compensation voltage to cancel all or some portion of the amplifier's DC offset voltage. In this embodiment, to generate a monotonic offset compensation voltage, a segmented converter architecture is employed. DAC 700 includes two operational amplifiers OP1 and OP2, resistors R00 through R28, and capacitor C00. According to a specific embodiment, resistors R00, R01 and R02 are each 5 kΩ, resistors R03-R28 are each 40 kΩ, and capacitor C00 is 10 pF.

As mentioned above, the most significant bit (MSB) of DAC 700, i.e., bit B9, is used to select the DAC's reference voltage, i.e., either VREFP or VREFM. That is, when B9=1, positive reference voltage VREFP=3.5 V is selected as the DAC's reference voltage. When B9=0, negative reference voltage VREFM=1.5 V is selected. As the DAC's ground VCM is set to 2.5 V, the full scale output of DAC 700 is ±1 V.

The six least significant bits (LSBs) of DAC 700, i.e., bits B5–B0, are used to control corresponding switches which configure an R–2R binary scaled ladder and thereby convert these bits to an analog voltage. Bits B8, B7, and B6 are converted from binary to thermometer code by conversion circuitry 702. The conversion truth table is shown in the figure. Thermometer code B00–B06 are used to control corresponding switches to complete the resistor network configuration. Thus, the 10 bits of input data (B9–B0) are used to select a reference voltage and configure a resistor network, and to thereby convert those input data to analog voltages VDCP and VDCM, where VDCM is the inverted version of VDCP. This fully differential offset compensation voltage is then fed back to the amplifier's input stage to cancel its DC offset voltage as shown in FIG. 4.

Referring once again to FIG. 4, the offset compensation voltage generated by DAC 404 is fed back to the input stage of amplifier 400 via resistors RF1 and RF2 which, in a specific embodiment, are 20 times the values of input resistors R1 and R2, respectively. Given a ±1 V output range of the DAC 404, this results in an equivalent input referred DC offset calibration range of ±50 mV. As will be understood, the calibration range can be manipulated via manipulation of the appropriate resistor values. For example, by reducing the values of RF1 and RF2, the calibration range may be correspondingly increased. In addition, because of the ratios of RF1:R1 and RF2:R2, the noise contribution of DAC 404 to amplifier 400 is reduced by the same value. Thus, according to the described embodiment in which the ratio is 20:1, the noise from the offset calibration circuit is attenuated by 26 dB before its output is applied to the input stage of the amplifier. This provides a great deal of flexibility with regard to the design of the calibration circuit and, specifically, the DAC.

While the invention has been particularly shown and described with reference to specific embodiments thereof, it will be understood by those skilled in the art that changes in the form and details of the disclosed embodiments may be made without departing from the spirit or scope of the invention. For example, specific embodiments have been described with reference to an audio amplifier. It will be understood, however, that the techniques described herein may be applied to a variety of different amplifier configurations without departing from the invention. Therefore, the scope of the invention should be determined with reference to the appended claims.

What is claimed is:

1. An offset voltage calibration and compensation circuit for use with a digital switching amplifier comprising a frequency selective network and a comparator, the circuit comprising:
 a memory for storing digital offset data and outputting the digital offset data in response to output level data representative of an output level of the digital switching amplifier, the digital offset data corresponding to a DC offset voltage which corresponds to the output level;
 a digital-to-analog converter coupled to the memory for receiving the digital offset data and generating an offset compensation voltage for applying to an input port of the digital switching amplifier thereby canceling at least a portion of the DC offset voltage; and
 a successive approximation register which is used in conjunction with the frequency selective network, the comparator, and the digital-to-analog converter in a calibration mode to generate the digital offset data.

2. The offset voltage calibration and compensation circuit of claim 1 wherein the frequency selective network, the comparator, the digital-to-analog converter and the successive approximation register form a successive approximation type analog-to-digital converter in the calibration mode.

3. The offset voltage calibration and compensation circuit of claim 2 further comprising control circuitry for controlling the analog-to-digital converter, and wherein the digital switching amplifier comprises at least one switch controlled by the control circuitry which configures the analog-to-digital converter for generation of the digital offset data.

4. The offset voltage calibration and compensation circuit of claim 2 wherein the analog-to-digital converter comprises a 10-bit successive approximation type analog-to-digital converter.

5. The offset voltage calibration and compensation circuit of claim 1 wherein the digital offset data are generated for each of a plurality of DC offset voltages associated with the digital switching amplifier, each of the DC offset voltages corresponding to one of a plurality of output levels of the digital switching amplifier, the memory being configured to transmit a portion of the digital offset data to the digital-to-analog converter in response to the output level data representative of one of the output levels.

6. The offset voltage calibration and compensation circuit of claim 5 wherein the digital switching amplifier comprises an output level control circuit for controlling the digital switching amplifier to generate each of the plurality of output levels, and wherein the offset voltage calibration and control circuitry further comprises control circuitry for controlling the analog-to-digital converter, the memory being configured to receive the output level data from the output level control circuit in an operation mode in which the DC offset voltage is reduced, and the control circuitry being configured to control the output level control circuit in the calibration mode.

7. The offset voltage calibration and compensation circuit of claim 5 wherein the digital-to-analog converter has at least 10 bits of resolution and the memory has an at least 10-bit space for the digital offset data for each of a plurality of DC offset voltages.

8. A digital switching amplifier, comprising:
 an output level control circuit;
 a frequency selective network in a feedback loop;
 a comparator in the feedback loop;
 an analog-to-digital converter for converting each of a plurality of DC offset voltages to digital offset data, each of the DC offset voltages corresponding to a particular output level of the digital switching amplifier as controlled by the output level control circuit, the analog-to-digital converter comprising a successive approximation register;
 a memory for storing the digital offset data, the memory being configured to receive output level data from the output level control circuit;
 control circuitry for controlling the analog-to-digital converter and the memory to effect storage of the digital offset data; and
 a digital-to-analog converter coupled to the memory;
 wherein the memory transmits a portion of the digital data to the digital-to-analog converter in response to the output level data, and the digital-to-analog converter generates an offset compensation voltage in response to the portion of the digital data for applying to an input port of the digital switching amplifier thereby reducing the DC offset voltage, and wherein the analog-to-digital converter employs the frequency selective network, the comparator, the digital-to-analog converter and the successive approximation register to generate the digital offset data.

9. A method for reducing a DC offset voltage associated with a digital switching amplifier, comprising:
 amplifying the DC offset voltage;
 converting the amplified DC offset voltage to digital offset data using a successive approximation algorithm;
 storing the digital offset data in a memory;
 during normal operation of the digital switching amplifier, converting the digital offset data to an offset compensation voltage; and
 applying the offset compensation voltage to an input port of the digital switching amplifier thereby canceling at least a portion of the DC offset voltage.

10. A method for reducing a DC offset voltage associated with a digital switching amplifier, comprising:
 in a calibration mode:
  for each of a plurality of output levels of the digital switching amplifier amplifying and then converting a corresponding DC offset voltage to corresponding digital offset data using a successive approximation algorithm; and storing the digital offset data for each output level in a memory;

in an operation mode:

selecting a portion of the digital offset data from the memory in response to output level data indicating a corresponding output level of the digital switching amplifier;

converting the portion of the digital offset data to an offset compensation voltage; and applying the offset compensation voltage to an input port of the digital switching amplifier thereby canceling at least a portion of the DC offset voltage corresponding to the corresponding output level.

11. The method of claim 10 wherein each DC offset voltage is digitized with 10 bits of resolution, each of the 10 bits for each DC offset voltage being generated independently.

12. A digital switching amplifier, comprising:

an output level control circuit;

a frequency selective network in a feedback loop;

a comparator in the feedback loop;

an analog-to-digital converter for converting each of a plurality of DC offset voltages to digital offset data, each of the DC offset voltages corresponding to a particular output level of the digital switching amplifier as controlled by the output level control circuit;

a memory for storing the digital offset data, the memory being configured to receive output level data from the output level control circuit;

control circuitry for controlling the analog-to-digital converter and the memory to effect storage of the digital offset data; and a digital-to-analog converter coupled to the memory;

wherein the memory transmits a portion of the digital offset data to the digital-to-analog converter in response to the output level data, and the digital-to-analog converter generates an offset compensation voltage in response to the portion of the digital offset data for applying to an input port of the digital switching amplifier thereby canceling at least a portion of the DC offset voltage.

* * * * *